United States Patent
Dammel

(10) Patent No.: US 7,033,728 B2
(45) Date of Patent: Apr. 25, 2006

(54) PHOTORESIST COMPOSITION

(75) Inventor: Ralph R. Dammel, Flemington, NJ (US)

(73) Assignee: AZ Electronic Materials USA Corp., Somerville, NJ (US)

(*) Notice: Subject to any disclaimer, the term of this patent is extended or adjusted under 35 U.S.C. 154(b) by 0 days.

(21) Appl. No.: 10/748,778

(22) Filed: Dec. 29, 2003

(65) Prior Publication Data

US 2005/0147915 A1   Jul. 7, 2005

(51) Int. Cl.
G03C 1/73      (2006.01)
G03F 7/039     (2006.01)
G03F 7/20      (2006.01)
G03F 7/30      (2006.01)

(52) U.S. Cl. .............. 430/270.1; 430/905; 430/906; 430/907; 430/909; 430/910; 430/914; 430/921; 430/925; 430/326; 430/330; 430/311; 430/331; 430/942; 430/945; 430/327; 430/328; 568/28; 568/30; 568/579; 568/665; 558/44; 526/281

(58) Field of Classification Search ............ 430/270.1, 430/905, 906, 909, 910, 907, 921, 925, 922, 430/919, 920, 326, 311, 330, 328, 327, 942, 430/945, 331; 526/280, 281

See application file for complete search history.

(56) References Cited

U.S. PATENT DOCUMENTS

| 4,701,390 | A | * | 10/1987 | Grunwald et al. .......... 430/325 |
| 5,019,660 | A | | 5/1991 | Chapman et al. ............. 585/22 |
| 5,736,301 | A | * | 4/1998 | Fahey et al. ................ 430/325 |
| 5,910,392 | A | * | 6/1999 | Nozaki et al. ........... 430/270.1 |
| 6,447,980 | B1 | * | 9/2002 | Rahman et al. .......... 430/270.1 |
| 6,783,589 | B1 | | 8/2004 | Dahl et al. ..................... 117/84 |
| 6,824,956 | B1 | | 11/2004 | Sato ........................ 430/270.1 |
| 2002/0177743 | A1 | | 11/2002 | Dahl et al. ..................... 585/16 |
| 2003/0194640 | A1 | | 10/2003 | Sato ........................ 430/270.1 |
| 2003/0199710 | A1 | | 10/2003 | Liu et al. ..................... 562/498 |
| 2005/0074690 | A1 | | 4/2005 | Liu et al. ................. 430/270.1 |

FOREIGN PATENT DOCUMENTS

| EP | 1 338 922 | 1/2003 |
| EP | 1 338 922 | 8/2003 |
| WO | WO 2005/036265 | 4/2005 |

OTHER PUBLICATIONS

"Diamondoid Hycrocarmons—Delving into Nature's Bounty", Alan P. Marchand, Science, vol. 299, Jan. 3, 2003, pp. 52-53.

"Isolation and Structure of Higher Diamondoids, Nanometer-Sized Diamond Molecules", J. E. Dahl et al., Science, vol. 299, Jan. 3, 2003, pp. 96-99.

"A Novel Polymer For A 193-nm Resist", K. Nozaki et al., Journal of Photopolymer Science and Technology, vol. 9, No. 3 (1996), pp. 509-522.

(Continued)

*Primary Examiner*—Sin Lee
(74) *Attorney, Agent, or Firm*—Alan P. Kass

(57) ABSTRACT

The present invention relates to a photosensitive composition useful at wavelengths between 300 nm and 10 nm which comprises a polymer containing a substituted or unsubstituted higher adamantane.

26 Claims, 9 Drawing Sheets

OTHER PUBLICATIONS

"Design of cycloolefin-maleic anhydride resist for ArF lithography", J-C. Jung et al., SPIE, vol. 3333 Part 1, Feb. 23-25, 1998, pp. 11-25.

"Adhesion Characteristics of Alicyclic Polymers for use in ArF Excimer Laser Lithography", K. Nakano et al., SPIE, vol. 3333 Part 1, Feb. 23-25, 1998, pp. 43-52.

"Reactive ion etching of 193 nm resist candidates: current platforms, future requirements", T. Wallow et al., SPIE, vol. 3333 Part 1, Feb. 23-25, 1998, pp. 92-101.

Notification of Transmittal of The International Search Report and the Written Opinion of the International Searching Authority, or the Declaration; the International Search Report; and the Written Opinion for PCT/IB2004/004384.

PCT International Search Report (Form PCT/ISA/206) for PCT/IB2004/004384.

* cited by examiner

PHOTORESIST COMPOSITION

FIELD OF INVENTION

The present invention relates to a photoresist composition sensitive to actinic radiation, particularly a positive working photoresist sensitive in the range of 10–300 nanometers (nm). The present invention also relates to a process for imaging the photoresist composition.

BACKGROUND OF INVENTION

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The photoresist coated on the substrate is next subjected to an image-wise exposure to radiation.

The radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation exposed or the unexposed areas of the photoresist.

The trend towards the miniaturization of semiconductor devices has led to the use of new photoresists that are sensitive to lower and lower wavelengths of radiation and has also led to the use of sophisticated multilevel systems to overcome difficulties associated with such miniaturization.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g., a chemical reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

Photoresists sensitive to short wavelengths, between about 100 nm and about 300 nm can also be used where sub-half micron geometries are required. Particularly preferred are photoresists comprising non-aromatic polymers, a photoacid generator (PAG), optionally a solubility inhibitor, and solvent.

High resolution, chemically amplified, deep ultraviolet (100–300 nm) positive and negative tone photoresists are available for patterning images with less than quarter micron geometries. Chemically amplified resists, in which a single photo generated proton catalytically cleaves several acid labile groups, are used in photolithography applicable to sub quarter-micron design rules. As a result of the catalytic reaction, the sensitivity of the resulting resist is quite high compared to the conventional novolak-diazonaphthoquinone resists. To date, there are three major deep ultraviolet (UV) exposure technologies that have provided significant advancement in miniaturization, and these are lasers that emit radiation at 248 nm, 193 nm and 157 nm. Examples of such photoresists are given in the following patents and incorporated herein by reference, U.S. Pat. No. 4,491,628, U.S. Pat. No. 5,350,660, U.S. Pat. No. 5,843,624 and GB 2320718. Photoresists for 248 nm have typically been based on substituted polyhydroxystyrene and its copolymers. On the other hand, photoresists for 193 nm exposure require non-aromatic polymers, since aromatics are opaque at this wavelength. Generally, alicyclic hydrocarbons are incorporated into the polymer to replace the etch resistance lost by the absence of aromatics.

Photoresists based on chemical amplification mechanism are employed for 248 nm, 193 nm, 157 nm, and 13.4 nm applications. However, the resist materials applicable for 248 nm cannot be used at 193 nm due to the high absorption of the poly(4-hydroxystyrene) based polymers used for 248 nm applications. 193 nm applications typically require non-aromatic compounds. Open-chain aliphatic resins cannot be used due to the very high etch rates of these materials. Polymers possessing annelated structures in the side chains such as tricyclododecyl and adamantane or cycloolefins in the main chain are shown to provide etch resistance close to poly(4-hydroxystyrene) polymers [Nakano et al. Proc. SPIE 3333, 43 (1998), Nozaki et al. J. Photopolym. Sci. & Tech. Vol. 9, 11, (1998), T. I. Wallow et al. Proc. SPIE 3333, 92 (1998), and J. C. Jung et al. Proc. SPIE 3333, 11, (1998)]. A variety of polymerizable groups can be used in the side-chain bearing monomers, including but not limited to acrylates or methacrylates and their higher homologs, cyanoacrylates, or vinyl ethers.

For Extreme UV applications (EUV) at the wavelength of typically 13.4 nm, the absorption of the film is determined only by the atomic composition of the film, and its density, regardless of the chemical nature of the atom's binding. The absorption of the film can thus be calculated as a sum of the atomic inelastic x-ray scattering cross sections $f_2$. Polymers with high carbon content are found to be suitable due to the comparatively low $f_2$ factor for carbon; a high oxygen content is unfavorable for absorption because of the high $f_2$ factor for oxygen. Since the chemical nature of the carbon atom binding does not matter, aromatic units, e.g., phenols such a polyhydroxystyrene (PHS) and its derivatives can and have been used.

U.S. patent Publication 2002/0130407 describes polymers where diamondoid monomers are linked through carbon-to-carbon covalent bonds where the covalent bond is between two carbon atoms where each of carbon atoms of the bond are members of the two adjacent diamondoids; where two adjacent diamondoids may be covalently linked through carbon atoms that are not members (part of the carbon nucleus) of either of the two diamondoids, for example through ester linkages, amide linkages, and ether linkages; and a copolymer formed from the monomers ethylene and a higher diamondoid having at least one ethylene substituent. U.S. patent Publication 2002/0177743 describes the design of a carbon-rich cyclopolymer incorporating both imageable functionalities (tert-butyl esters) for chemical amplification, and high etch-resistance moieties (higher diamondoids such as tetramantanes, pentamantanes, hexamantanes and the like). U.S. patent Publication 2003/0199710 describes three major representative reactions sorted by mechanism for the formation of primary functionalized higher diamondoids and some representative secondary functionalized materials which can be prepared from them.

SUMMARY OF INVENTION

The present invention relates to a photoresist composition comprising a) a polymer that is insoluble in an aqueous alkaline solution and comprises at least one acid labile group, and comprises at least one monomer unit having a pendant group selected from unsubstituted or substituted higher adamantanes and mixtures thereof; and, b) a compound capable of producing acid upon irradiation.

Examples of the monomer unit include

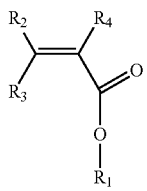

(1A)

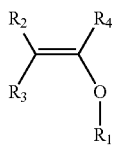

(1B)

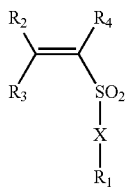

(1C)

$R_1$ is -Z or —Y-Z where Y is a linear or branched alkylene or a monocyclic or polycyclic alkylene, Z is unsubstituted or substituted higher adamantane; $R_2$, $R_3$, and $R_4$ are each independently selected from hydrogen, hydroxyalkyl, alkyl, alkoxyalkyl, alkoxycycloalkyl, cycloalkyl, cycloalkyloxy, cycloalkenyl, aryl, aryloxy, aralkyl, and CN or any two of $R_2$, $R_3$, and $R_4$ together with the carbon atoms to which they are attached form an unsubstituted or substituted mono- or polycycloalkenyl; X is O or $NR_2$. Examples of substituents on the higher adamantane include hydroxy, hydroxyalkyl, alkyl, alkoxy, aryl, cycloalkyl, cycloalkyloxy, alkoxyalkyl, alkoxycycloalkyl, aryloxy, halogen, —O—$(CH_2)_n$—COOtBu, where n is 1 to 5, and where a carbon atom within the higher adamantane is replaced by A-$(CH_2)_j$—C(=O)—O—B where j is 0 to 5 and A and B represent direct bonds to adjacent carbon atoms to the replaced carbon atom.

The photoresist can be irradiated with wavelengths of light ranging from about 10 nm to about 300 nm; for example, at 193 nm or 157 nm or 13.4 nm.

The invention also relates to a process of imaging the positive photoresist composition of the present invention comprising the steps of a) coating a substrate with the photoresist composition, b) baking the substrate to substantially remove the solvent, c) imagewise irradiating the photoresist film, d) baking the photoresist, and e) developing the irradiated film using an alkaline developer. The invention further relates to a process of making such a polymer by a free radical polymerization mechanism.

In addition, the invention also relates to a compound of the formula

(1)

wherein $R_{20}$ is selected from

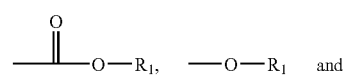
 and

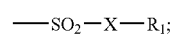

$R_1$ is -Z or —Y-Z where Y is a linear or branched alkylene or a monocyclic or polycyclic alkylene, Z is unsubstituted or substituted higher adamantane; $R_2$, $R_3$, and $R_4$ are each independently selected from hydrogen, alkyl, alkoxyalkyl, cycloalkyl, cycloalkenyl, aryl, aralkyl, and CN or any two of $R_2$, $R_3$, and $R_4$ together with the carbon atoms to which they are attached form an unsubstituted or substituted mono- or polycycloalkenyl; X is O or $NR_2$.

In addition, the invention relates to a polymer comprising at least one repeating unit represented by formula (2)

(2)

wherein $R_{20}$ is selected from

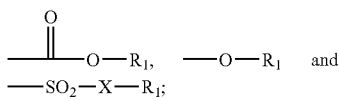

$R_1$ is -Z or —Y-Z where Y is a linear or branched alkylene or a monocyclic or polycyclic alkylene, Z is unsubstituted or substituted higher adamantane; $R_2$, $R_3$, and $R_4$ are each independently selected from hydrogen, alkyl, alkoxyalkyl, cycloalkyl, cycloalkenyl, aryl, aralkyl, and CN or any two of $R_2$, $R_3$, and $R_4$ together with the carbon atoms to which they are attached form an unsubstituted or substituted mono- or polycycloalkenyl; X is O or $NR_2$.

DETAILED DESCRIPTION OF THE INVENTION

Figure 1:
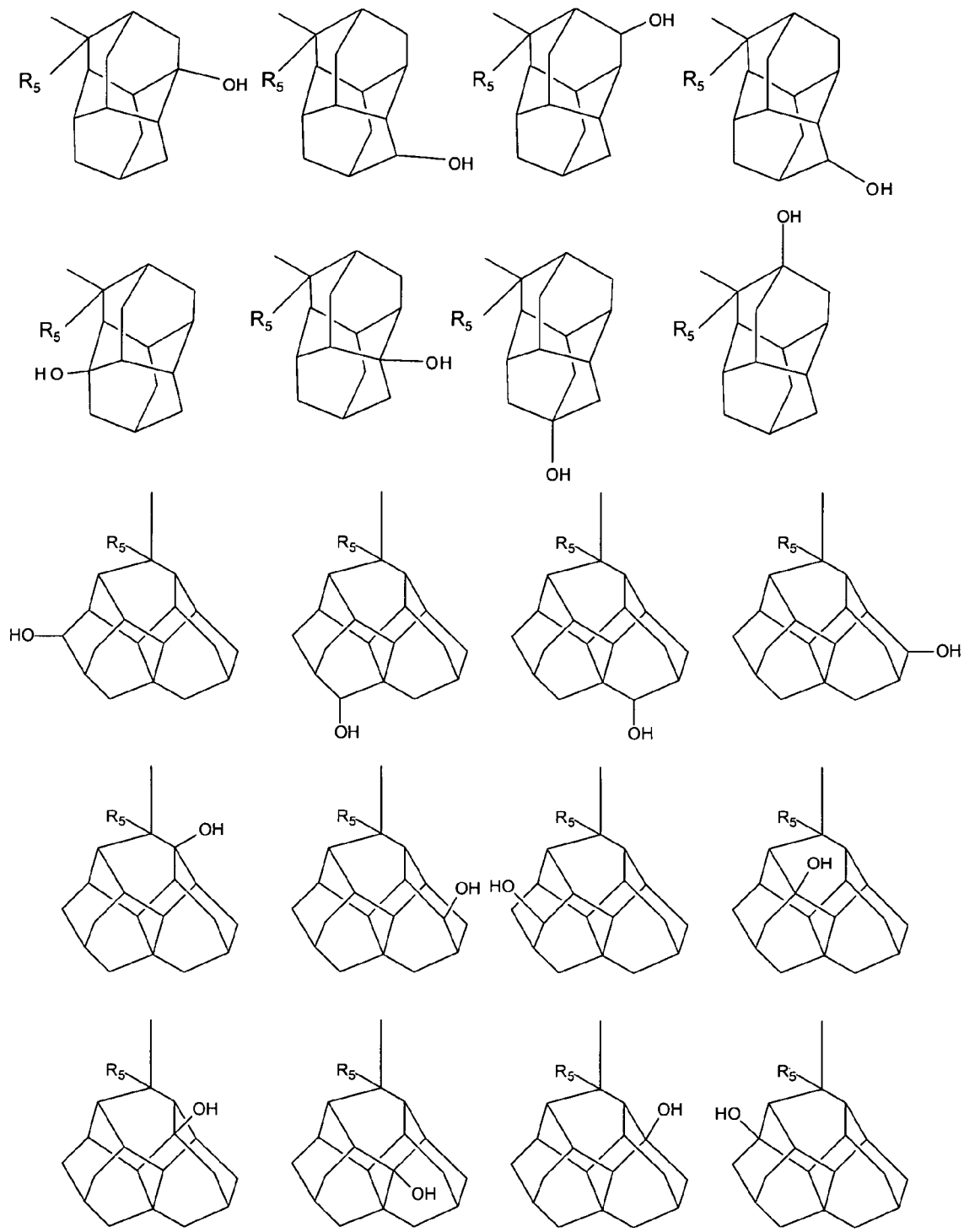
FIG. 1 to FIG. 9 show examples of substituted higher diamantanes.
Figure 2:
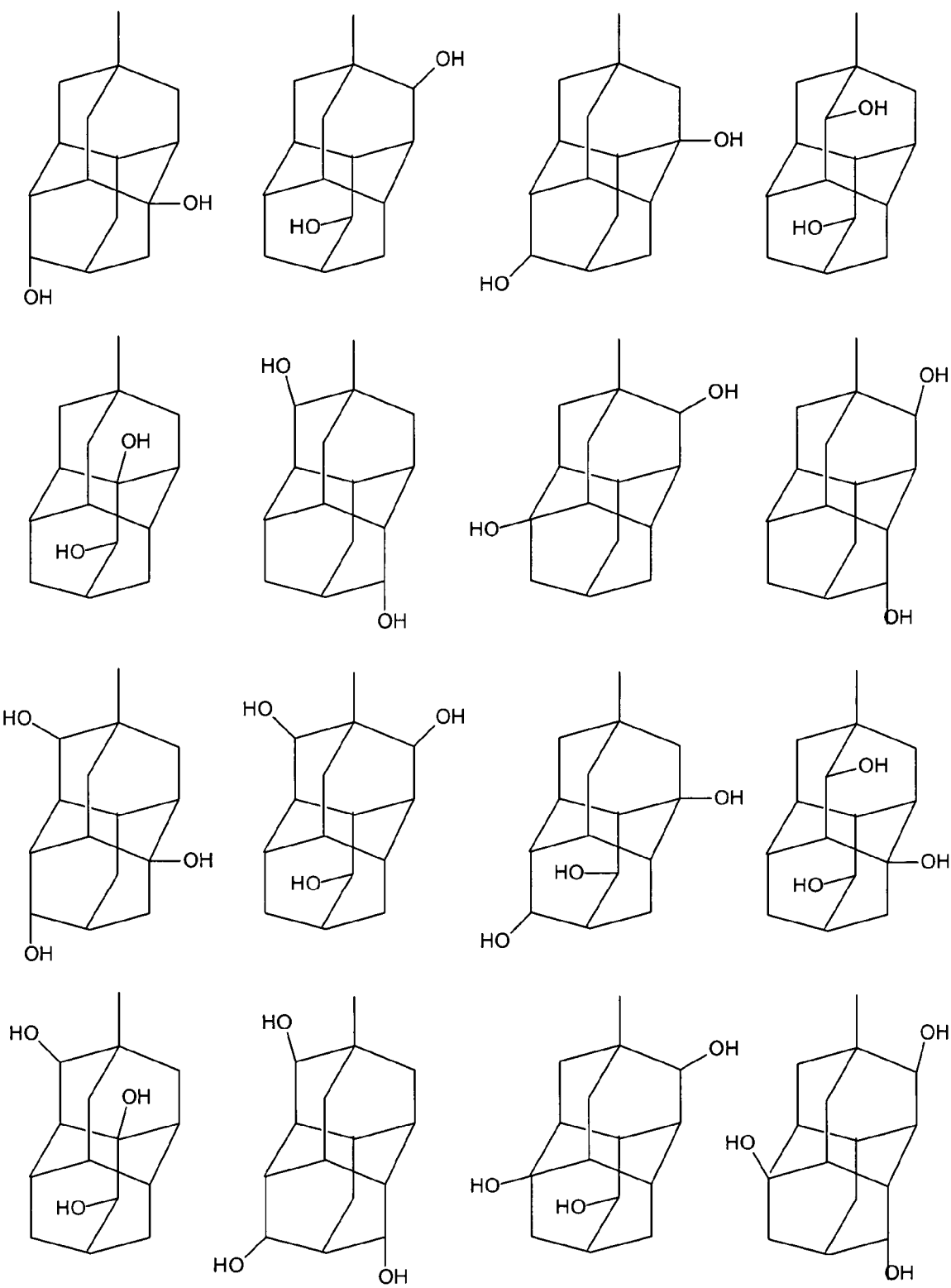
Figure 3:
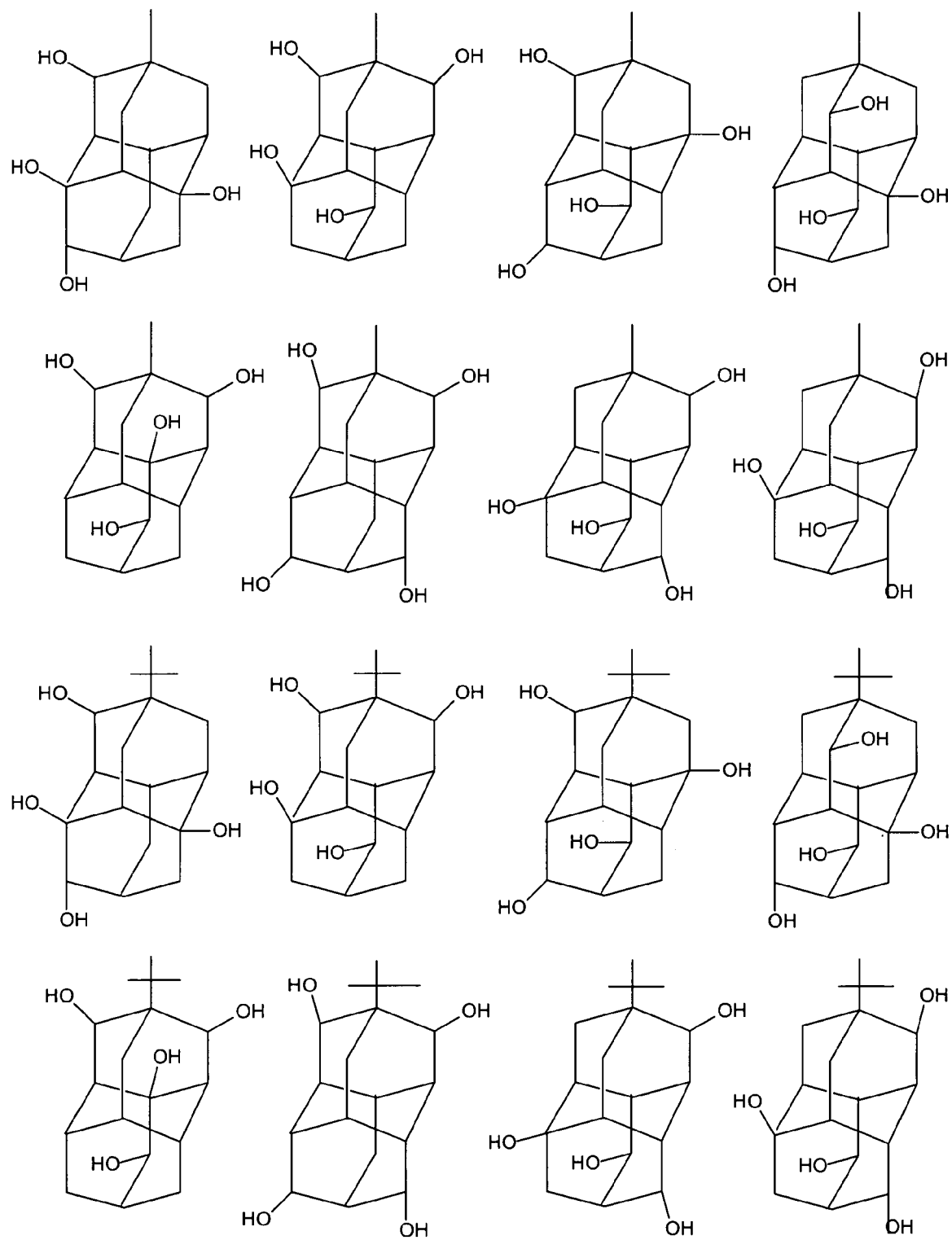
Figure 4:
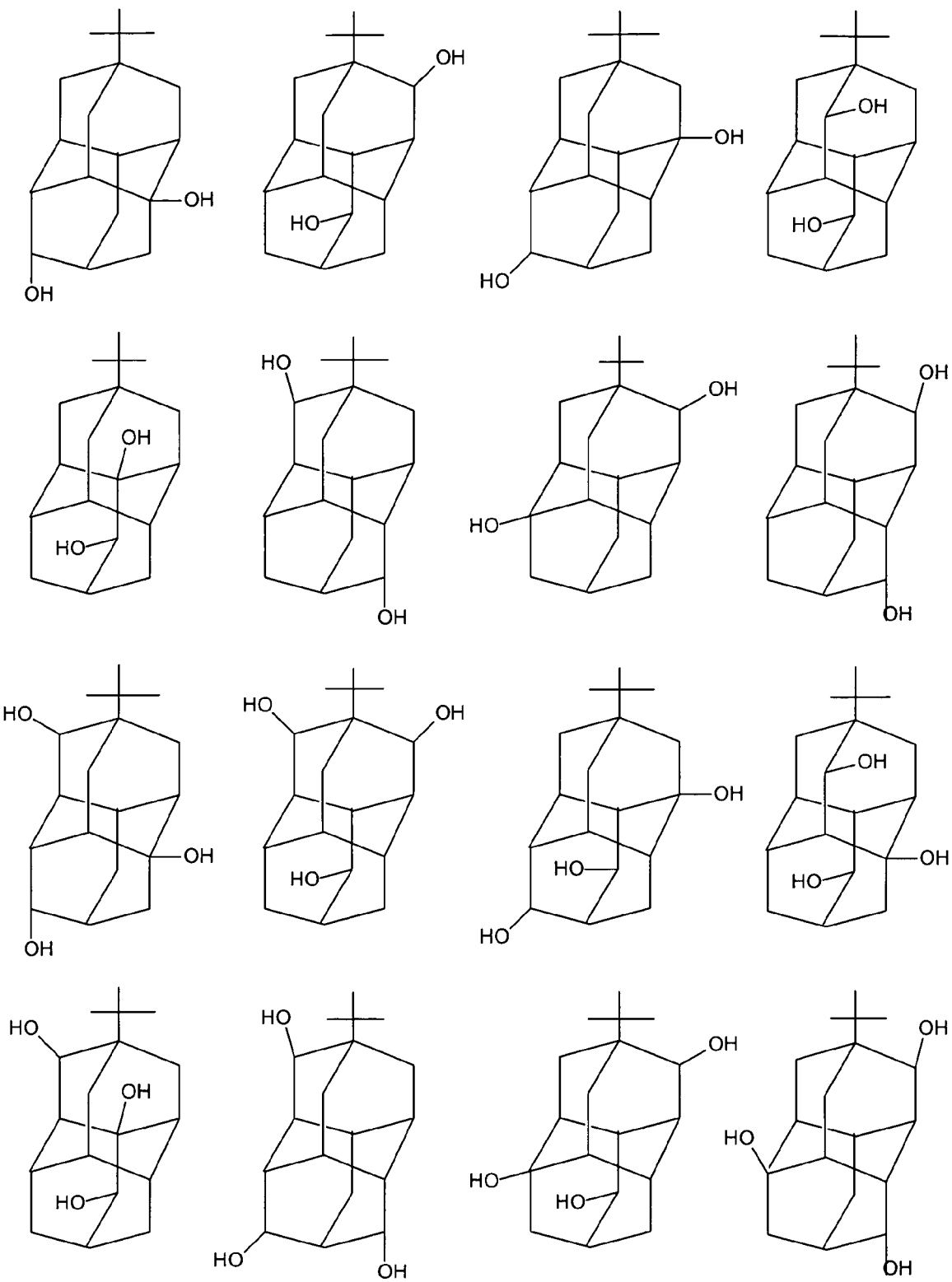
Figure 5:
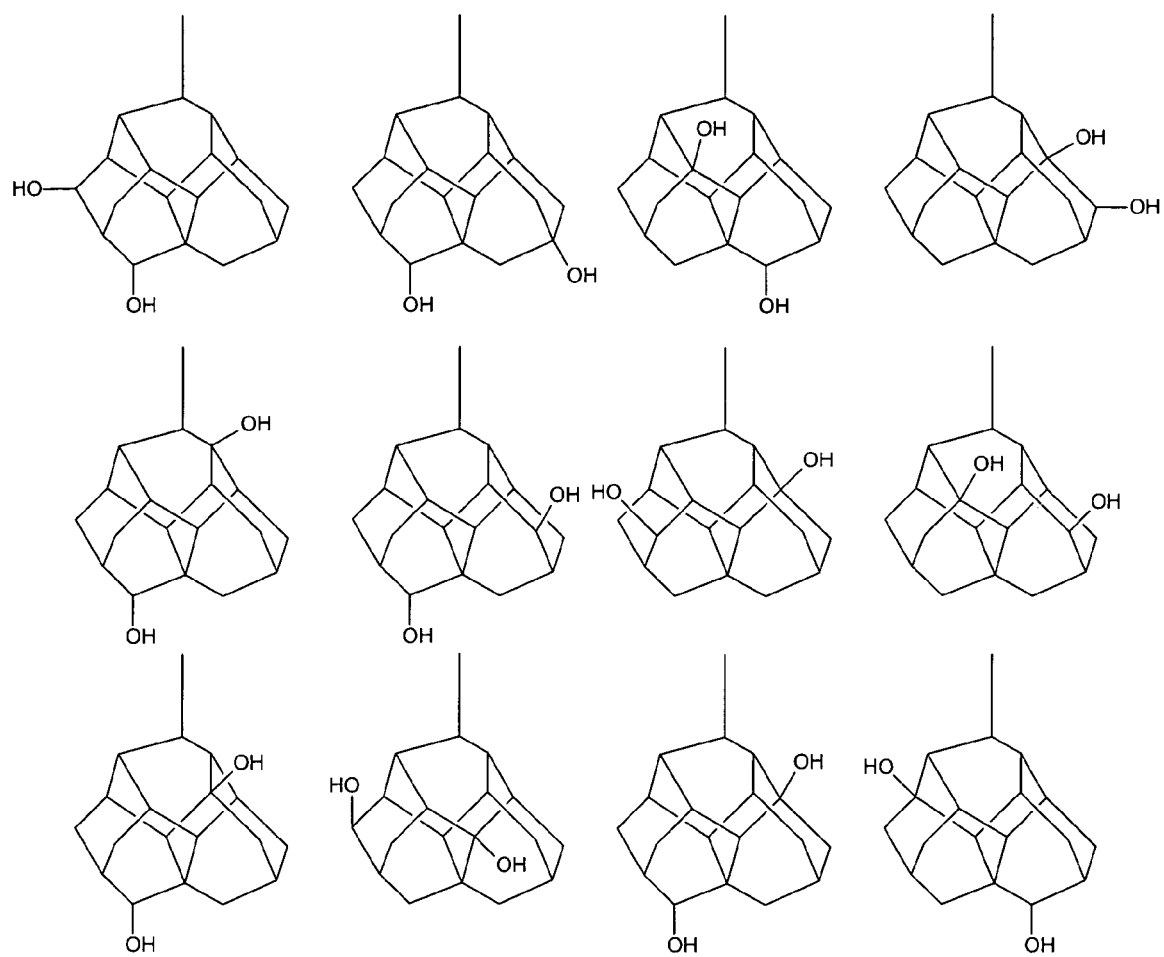
Figure 6:
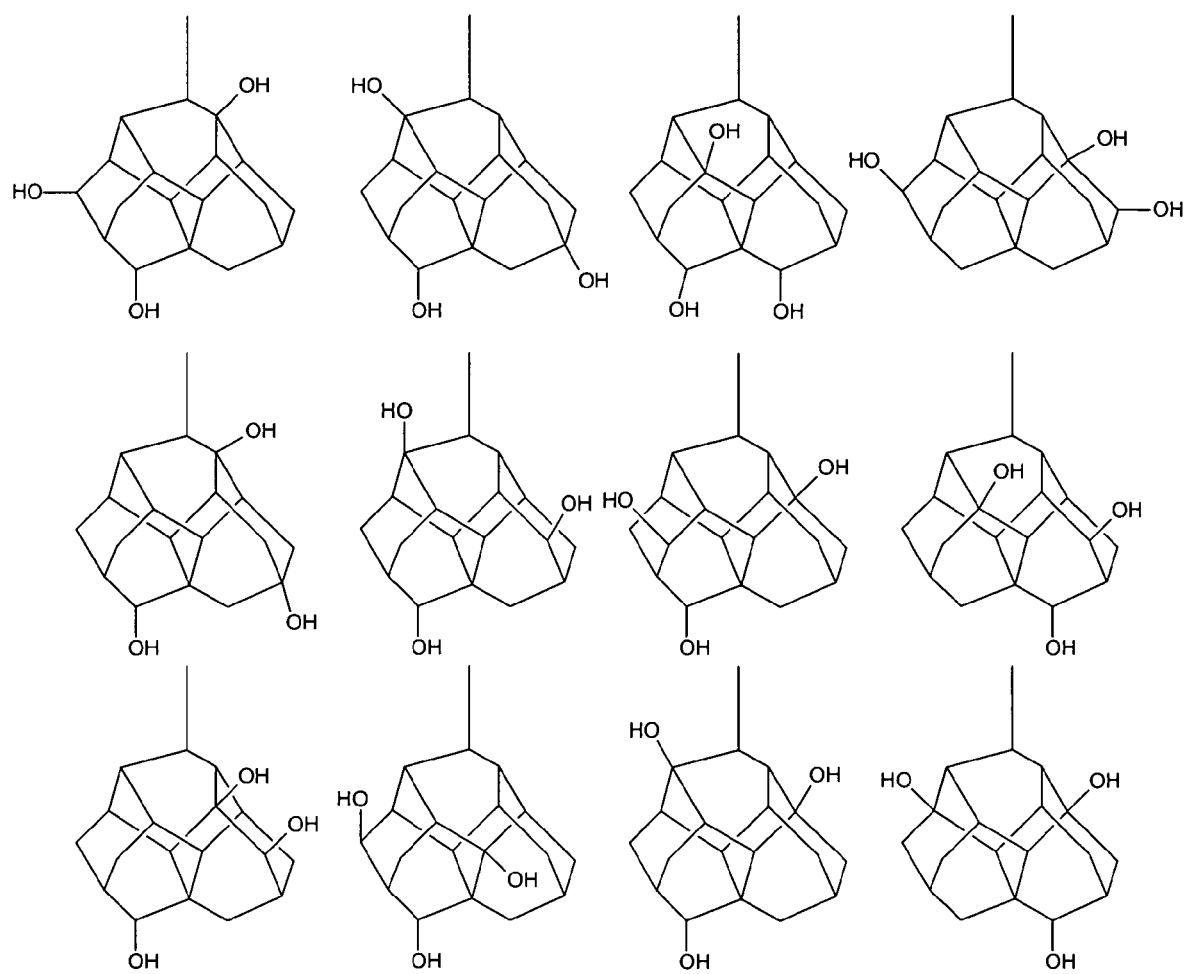
Figure 7:
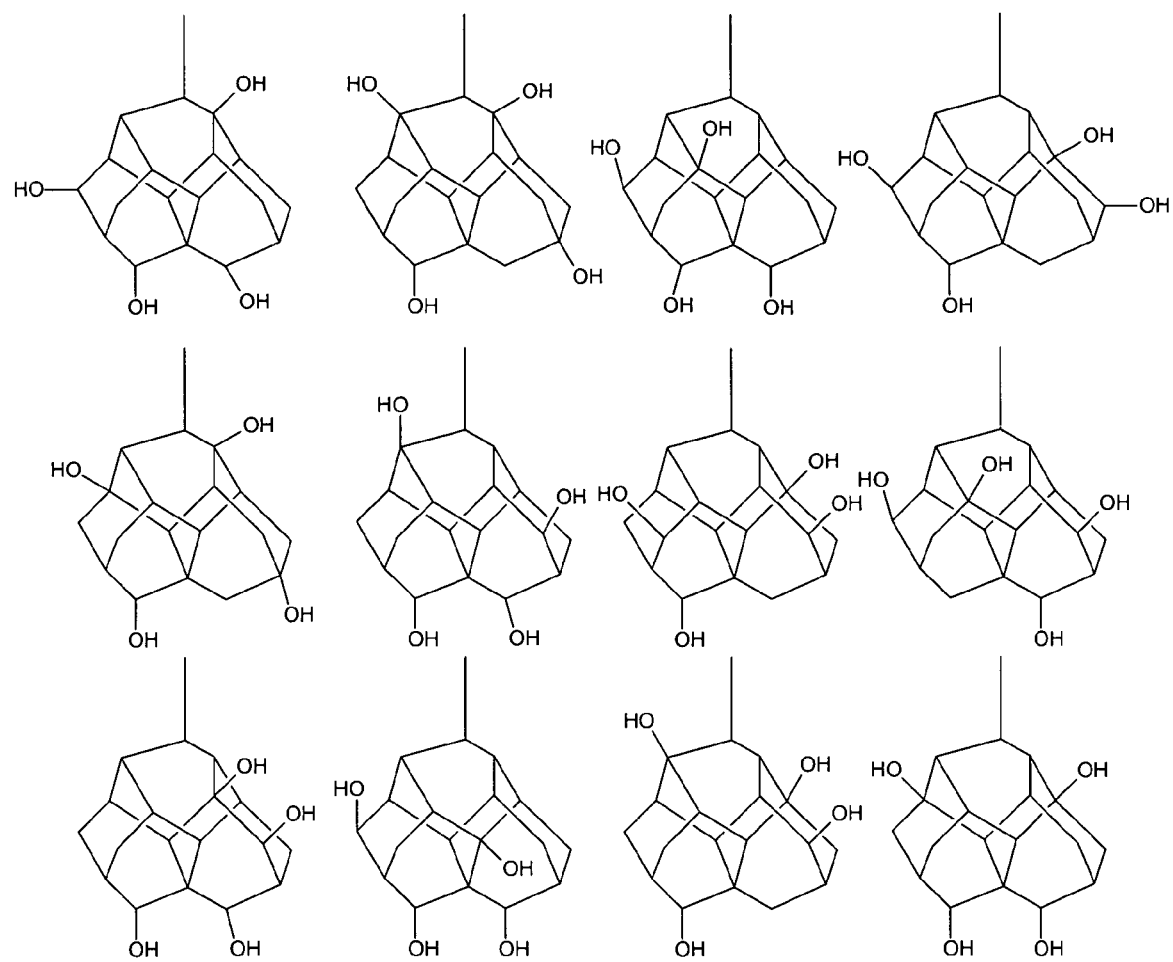
Figure 8:
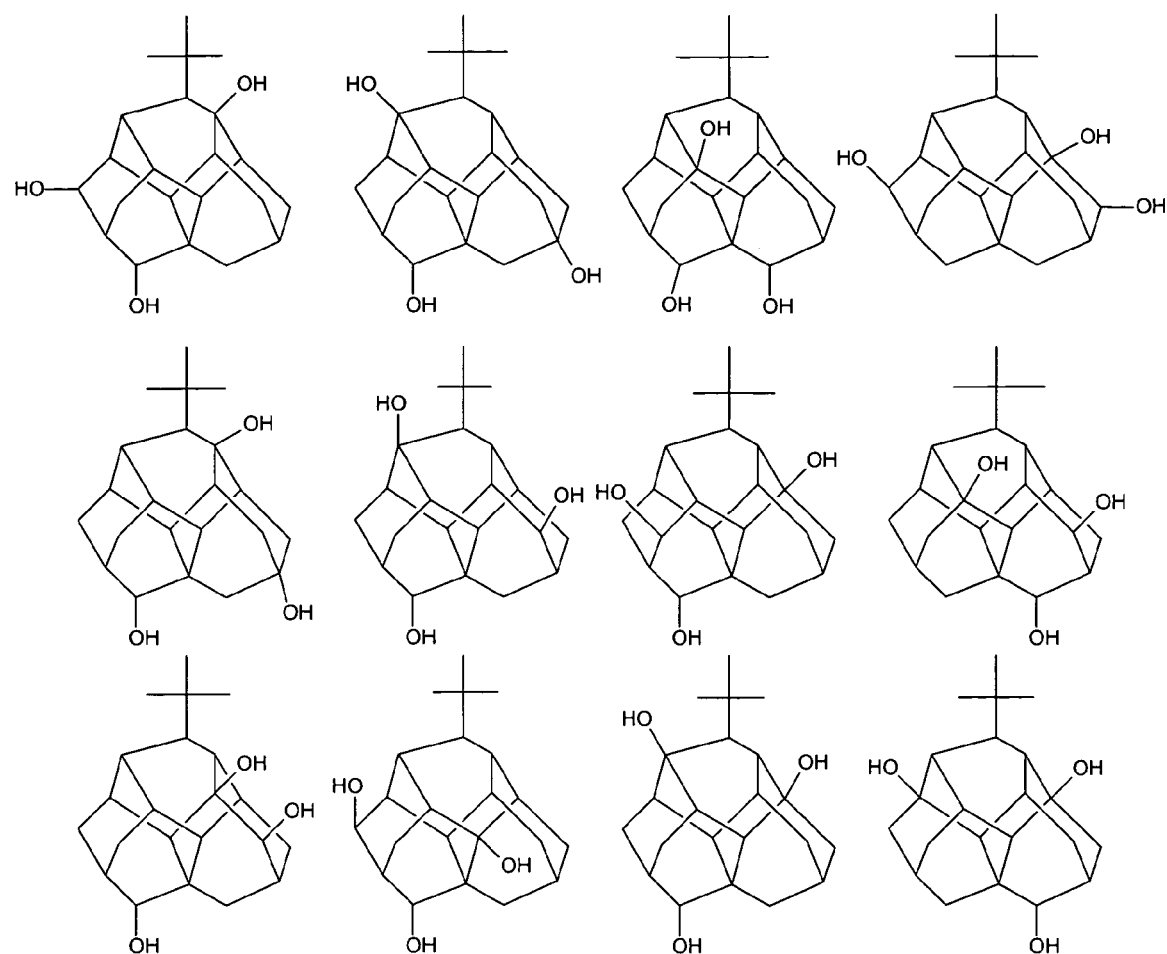
Figure 9:
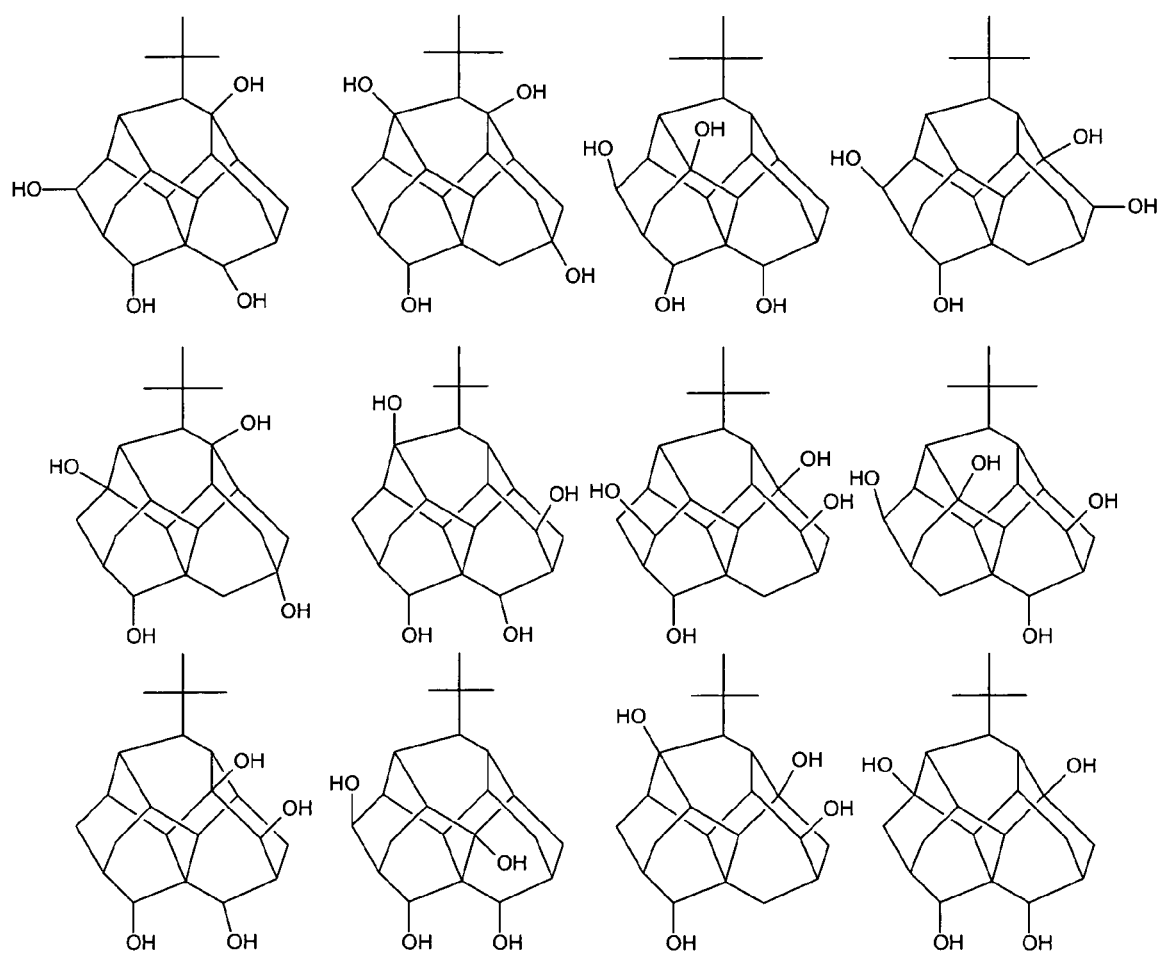

The present invention relates to a photoresist composition comprising a) a polymer that is insoluble in an aqueous alkaline solution and comprises at least one acid labile group, and comprises at least one monomer unit having a pendant group selected from unsubstituted or substituted higher adamantanes and mixtures thereof; and, b) a compound capable of producing acid upon irradiation.

Examples of the monomer unit include

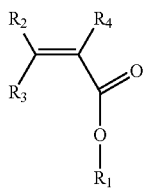
(1A)

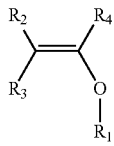
(1B)

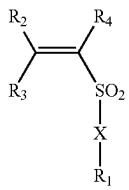
(1C)

$R_1$ is -Z or —Y-Z where Y is a linear or branched alkylene or a monocyclic or polycyclic alkylene, Z is unsubstituted or substituted higher adamantane; $R_2$, $R_3$, and $R_4$ are each independently selected from hydrogen, alkyl, alkoxyalkyl, cycloalkyl, cycloalkenyl, aryl, aralkyl, and CN or any two of $R_2$, $R_3$, and $R_4$ together with the carbon atoms to which they are attached form an unsubstituted or substituted mono- or polycycloalkenyl; X is O or $NR_2$. Examples of substituents on the higher adamantane include hydroxy, hydroxyalkyl, alkyl, alkoxy, aryl, cycloalkyl, cycloalkyloxy, alkoxyalkyl, alkoxycycloalkyl, aryloxy, halogen, —O—$(CH_2)_n$—COOtBu, where n is 1 to 5, and where a carbon atom within the higher adamantane is replaced by A-$(CH_2)_j$—C(=O)—O—B where j is 0 to 5 and A and B represent direct bonds to adjacent carbon atoms to the replaced carbon atom.

The photoresist can be irradiated with wavelengths of light ranging from about is 10 nm to about 300 nm; for example, at 193 nm or 157 nm or 13.4 nm.

The invention also relates to a process of imaging the positive photoresist composition of the present invention comprising the steps of a) coating a substrate with the photoresist composition, b) baking the substrate to substantially remove the solvent, c) imagewise irradiating the photoresist film, d) baking the photoresist, and e) developing the irradiated film using an alkaline developer. The invention further relates to a process of making such a polymer by a free radical polymerization mechanism.

In addition, the invention also relates to a compound of the formula

(1)

wherein $R_{20}$ is selected from

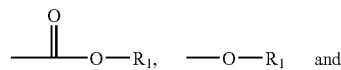
and

—$SO_2$—X—$R_1$;

$R_1$ is -Z or —Y-Z where Y is a linear or branched alkylene or a monocyclic or polycyclic alkylene, Z is unsubstituted or substituted higher adamantane; $R_2$, $R_3$, and $R_4$ are each independently selected from hydrogen, alkyl, alkoxyalkyl, cycloalkyl, cycloalkenyl, aryl, aralkyl, and CN or any two of $R_2$, $R_3$, and $R_4$ together with the carbon atoms to which they are attached form an unsubstituted or substituted mono- or polycycloalkenyl; X is O or $NR_2$.

In addition, the invention relates to a polymer comprising at least one repeating unit represented by formula (2)

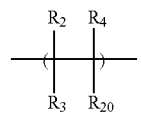
(2)

wherein

R$_{20}$ is selected from

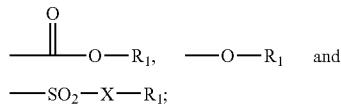

R$_1$ is -Z or —Y-Z where Y is a linear or branched alkylene or a monocyclic or polycyclic alkylene, Z is unsubstituted or substituted higher adamantane; R$_2$, R$_3$, and R$_4$ are each independently selected from hydrogen, alkyl, alkoxyalkyl, cycloalkyl, cycloalkenyl, aryl, aralkyl, and CN or any two of R$_2$, R$_3$, and R$_4$ together with the carbon atoms to which they are attached form an unsubstituted or substituted mono- or polycycloalkenyl; X is O or NR$_2$.

Examples of higher adamantanes include diamantane, triamantane, and tetramantane. In general, adamantanes have the general formula of C$_{(4k+6)}$H$_{(4k+12)}$ where k=0, 1, 2, 3, and so on. When k is 1, the formula is that of adamantane; when k is 2, the formula is that of diamantane; when k is 3, the formula is that of triamantane, and so forth.

The IUPAC numbering scheme for diamantane and triamantane is shown below (from U.S. Pat. No. 5,019,660 and U.S. Pat. No. 5,576,355)

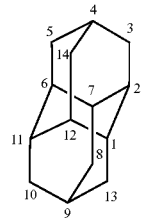

Diamantane

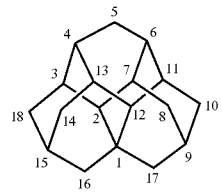

Triamantane

Examples of structures for Z include, for example, 3- (or 5-)alkyl-diamantanes and 5- or 18-alkyl-triamantanes, e.g.,

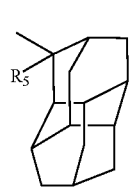 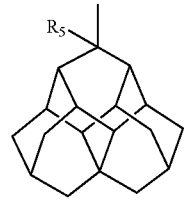

mono-hydroxylated 3-alkyl-diamantanes and 5- or 18-alkyl-triamantanes, e.g. those shown below and in FIG. 1.

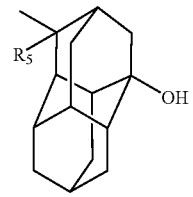 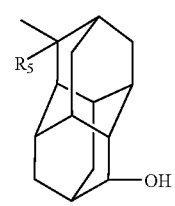

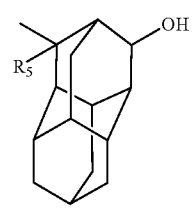 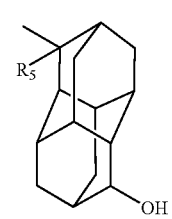

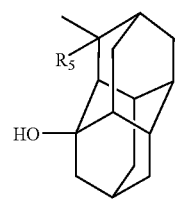 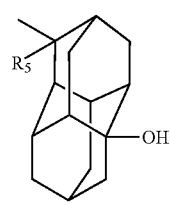

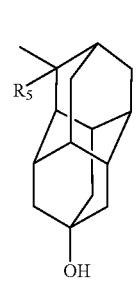 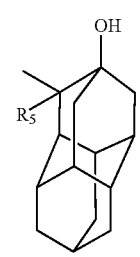

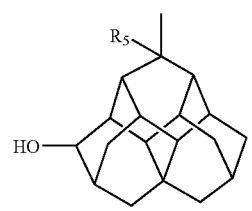 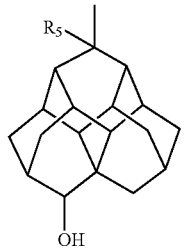

-continued
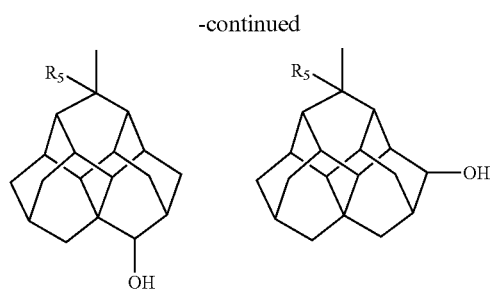
di-, tri-, and tetra-hydroxysubstituted di- and triamantanes, such as for example those shown below and in FIG. 2 to FIG. 9
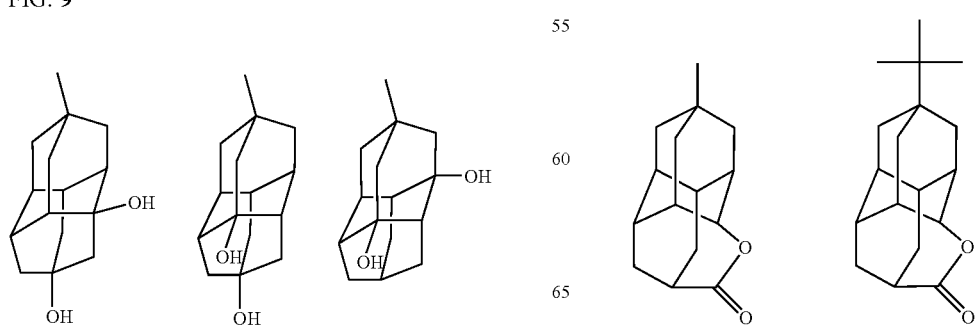
-continued
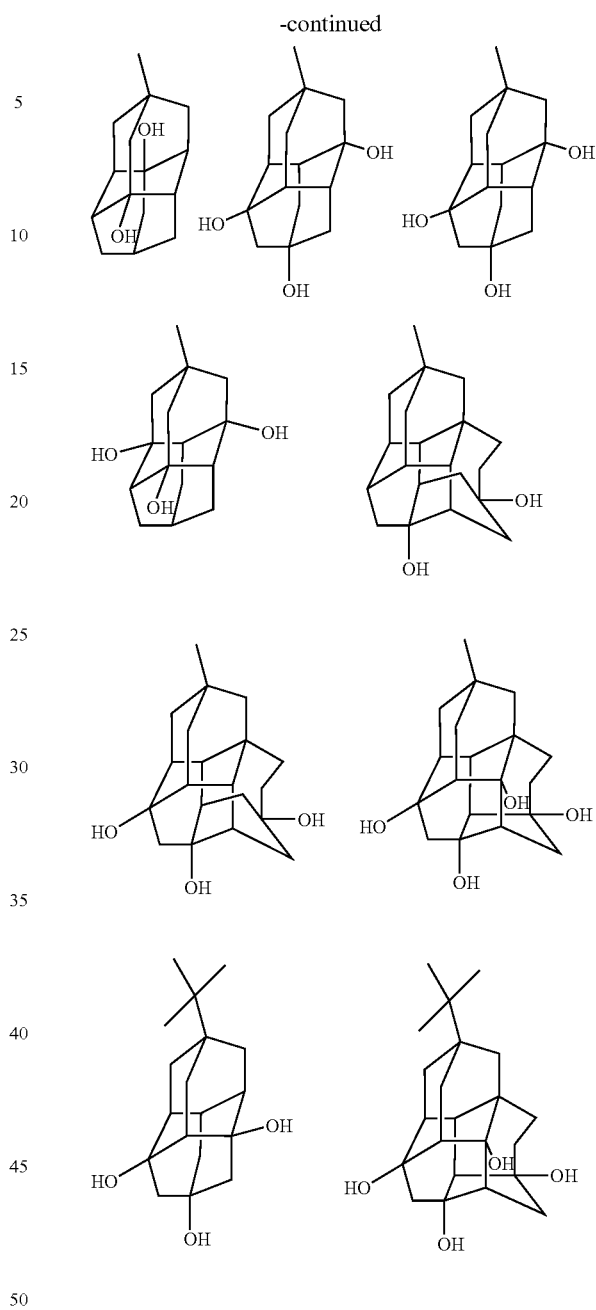
cyclic lactone derivatives of diamantanes and triamantanes, such as

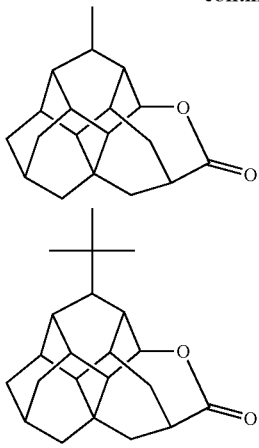

where R$_5$ stands for linear or branched alkyl, cycloalkyl, alkoxyalkyl or alkoxycycloalkyl, Examples include when R$_1$ is Z and Z is 2-methyldiamantane, 2-ethyldiamantane, and the various mono- and di-hydroxydiamantanes. Also other examples include aminodiamantane or substituted aminodiamantane in the form of the vinyl sulfonamide (for example, when X is NR$_2$).

Optionally, any free hydroxy groups of the above di-, tri- and tetramantanes may be substituted with alkyl carboxylate ether substituents, e.g., —(CH$_2$)$_n$—COOtBu, where n=1 to 5.

The term "aryl" refers to an unsaturated aromatic carbocyclic group of from 6 to 50 carbon atoms having a single ring or multiple condensed (fused) rings and include, but are not limited to, for example, phenyl, tolyl, dimethylphenyl, 2,4,6-trimethylphenyl, naphthyl, anthryl and 9,10-dimethoxyanthryl groups.

The term "aryloxy" refers to the group aryl-O— wherein the aryl group is as defined above.

The term "aralkyl" refers to an alkyl group containing an aryl group. It is a hydrocarbon group having both aromatic and aliphatic structures, that is, a hydrocarbon group in which an alkyl hydrogen atom is substituted by an aryl group, for example, phenyl, tolyl, benzyl, phenethyl and naphthylmethyl groups.

The term "cycloalkenyl" refers to cyclic alkenyl groups of from 4 to 50 carbon atoms having a single cyclic ring or multiple condensed (fused) rings and at least one point of internal unsaturation. Examples of cycloalkenyl groups include, for example, cyclobut-2-enyl, cyclopent-3-enyl, cyclooct-3-enyl and the like.

The term "cycloalkyl" refers to cyclic alkyl groups of from 3 to 50 carbon atoms having a single cyclic ring or multiple condensed (fused) rings. Examples include cyclopropyl group, cyclopentyl group, cyclohexyl group, cycloheptyl group, cyclooctyl, adamantyl, norbornyl, isoboronyl, camphornyl, dicyclopentyl, α-pinel, tricyclodecanyl, tetracyclododecyl and androstanyl groups. In these monocyclic or polycyclic cycloalkyl group, the carbon atom may be substituted by a heteroatom such as oxygen atom.

The term alkoxyalkyl means radicals of the formula C$_n$H$_{2n+1}$—O—(CH$_2$)$_m$—, in which n and m are each, independently of one another, from 1 to 6.

The term alkoxycycloalkyl means radicals of the formula C$_n$H$_{2n+1}$—O—R$_{10}$, in which n is 1 to 6 and R$_{10}$ is cycloalkyl.

Examples of the linear or branched alkylene group can have from 1 to 20 carbon atoms and include such as, for example, methylene, ethylene, propylene and octylene groups.

Examples of the monocyclic cycloalkylene group can have from 4 to 12 carbon atoms, and include such as, for example, cyclopentylene and cyclohexylene groups, and the polycyclic cycloalkylene group can have from 5 to 50 carbon atoms and include such as, for example, 7-oxabicyclo[2,2,1]heptylene, norbornylene, adamantylene, and the like.

Each of the hydroxyalkyl, alkyl, alkoxy, aryl, cycloalkyl, cycloalkylene, linear or branched alkylene, cycloalkenyl, cycloalkyloxy, alkoxyalkyl, alkoxycycloalkyl, and aryloxy group can be unsubstituted or substituted. Examples of substituents on these groups include, but are not limited to, for example, alkyl, cycloalkyl, aryl, amino, amido, ureido, urethane, hydroxyl, carboxyl, halogen, alkoxy, thioether, acyl (e.g., acetyl, propanoyl, benzoyl), acyloxy (e.g., acetoxy, propanoyloxy, benzoyloxy), alkoxycarbonyl (e.g., methoxycarbonyl, ethoxycarbonyl, propoxycarbonyl), cyano and nitro groups.

Besides the higher adamantane containing monomers of the present invention, the polymer may contain other monomers, for example, substituted acrylate and/or substituted methacrylate monomers, aliphatic cycloolefin monomer, cyclic anhydride monomer, and the like, capable of copolymerizing with the above monomers. For example, the acrylate and/or methacrylate monomers can contain pendant groups, such as for example, but not limited to:

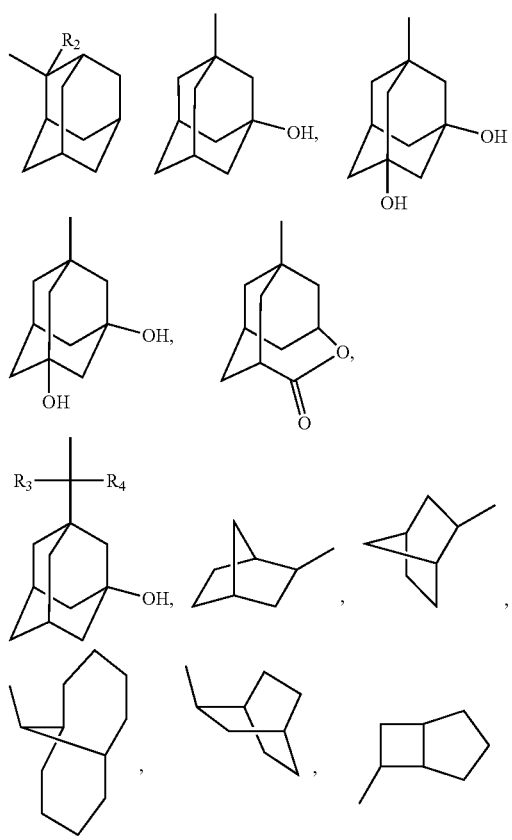

-continued

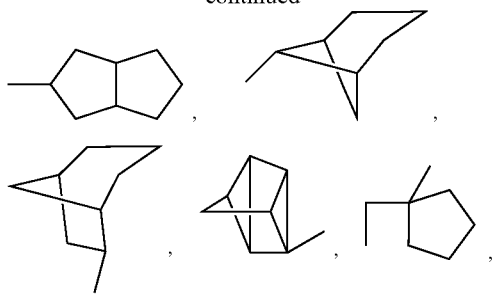

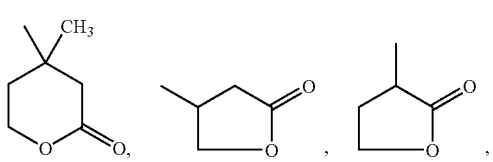

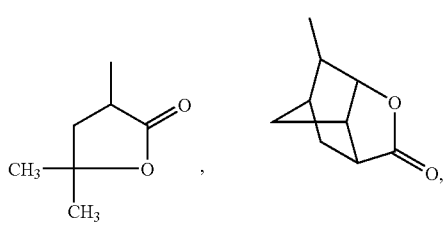

where $R_2$, $R_3$, and $R_4$ are as previously defined.

Examples of acrylate comonomers include mevalonic lactone methacrylate (MLMA), 2-methyladamantyl methacrylate (MAdMA), 2-ethyladamantyl methacrylate (EAdMA), 2-n-propyladamantyl methacrylate (PAdMA), isoadamantyl methacrylate, 3-hydroxy-1-methacryloxyadamatane, 3,5-dihydroxy-1-methacryloxy-adamantane, β-methacryloxy-γ-butyrolactone, and α-methacryloxy-γ-butyrolactone.

The cycloolefin is incorporated into the backbone of the polymer and may be any substituted or unsubstituted multicyclic hydrocarbon containing an unsaturated bond. The polymer may be synthesized from one or more cycloolefin monomers having an unsaturated bond. The cycloolefin monomers may be substituted or unsubstituted norbornene, or tetracyclododecene. The substituents on the cycloolefin may be aliphatic or cycloaliphatic alkyls, esters, acids, hydroxyl, nitrile or alkyl derivatives.

An example of the cyclic anhydride is maleic anhydride. Examples of cycloolefin monomers, include, without limitation:

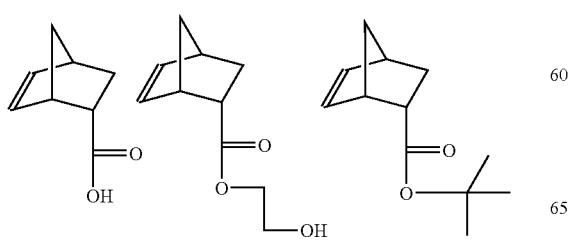

-continued

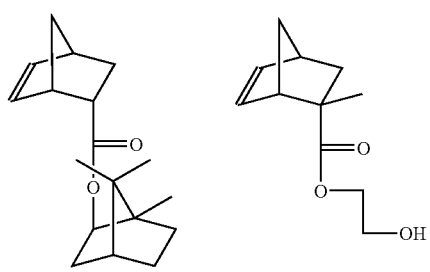

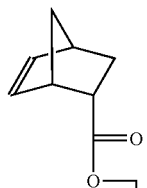

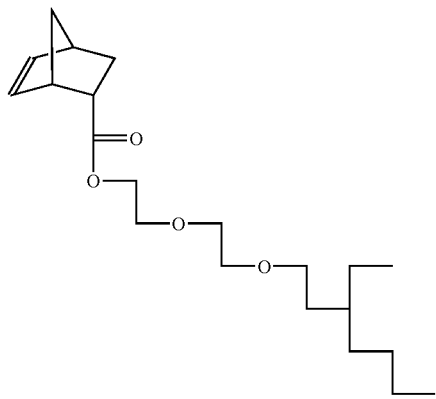

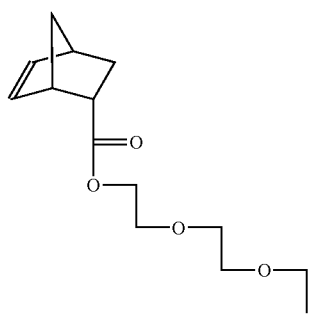

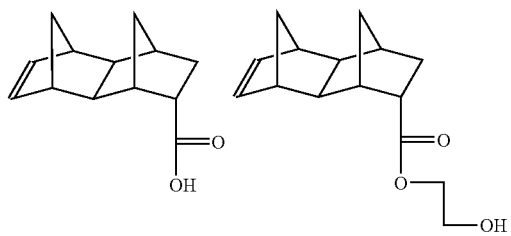

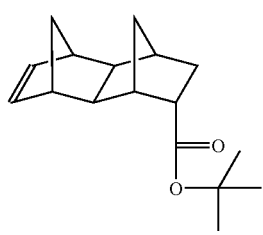

-continued

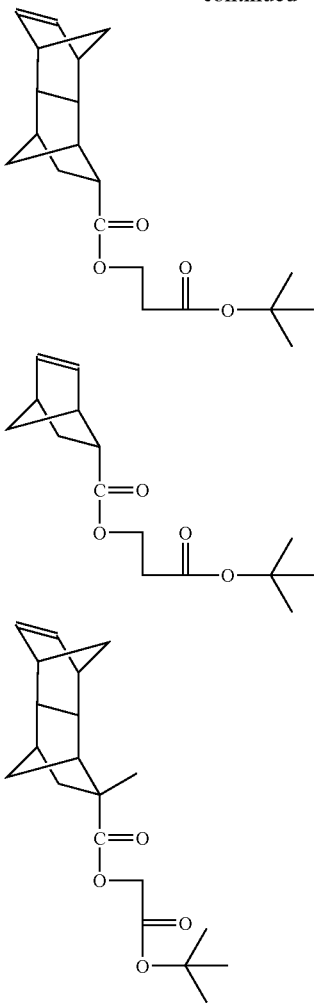

In this embodiment, the polymer of the invention may additionally comprise acrylate monomers, cyanoacrylates or vinyl ethers of the same type as mentioned above as co-monomers.

The monomers of this invention can be synthesized by functionalization of diadamantane or triamantane using techniques known in the art. For example, Schleyer [Journal of Organic Chemistry (1974), 39(20), 2987–94] and McKervey [Synthetic Communications (1973), 3(6), 435–9; Journal of the Chemical Society, Perkin Transactions 1: Organic and Bio-Organic Chemistry (1972–1999) (1972), (21), 2691–6] have described the oxidation of diamantane with sulfuric acid to yield diamantane-3-one. The ketone can be reacted with Grignard reagents such as methyl magnesium bromide or organometallic compounds such as methyl lithium to yield the 3-hydroxy-3-methyl derivative, which can be converted into the methacrylate ester by reaction with methacryloyl chloride. A similar reaction sequence for triamantane starts with the corresponding oxidation reaction to yield triamantane-8-one.

In another example, the reaction of diamantane with sulfuric acid and formic acid, followed by treatment with oxidizing agents such as $CrO_3$ or $HNO_3$ in acetic acid leads to a mixture of 9- and 1-hydroxy-substituted diamantane-3-ones [L. Vodicka et al., Coll. Czech. Chem. Commun. 49 (8), 1900–1906 (1984)]. After protection of the hydroxy-function, the ketone can be reacted with Grignard reagents such as methyl magnesium bromide or organometallic compounds such as methyl lithium to yield the 3-hydroxy-3-methyl derivative. The tertiary alcohol is then reacted with methacryloyl chloride to give the methacrylate ester. After removal of the protective group from the primary 9-hydroxy group, the monomer is purified by column chromatography or distillation in a wiped film evaporator.

Di- and trihydroxydiamantanes can be obtained through a variety of oxidation reactions, ranging from the oxidation with sulfuric acid reported by Schleyer, McKervey, and Vodicka, to the treatment of diamantane with lead(IV) acetate in trifluoroacetic acid [S. R. Jones et al., Journal of the Chemical Society, Perkin Transactions 2: Physical Organic Chemistry (1972–1999) (1977), (4), 511–17], to reaction with permanganates [B. P. Leddy et al., Tetrahedron Letters (1980), 21(23), 2261–4], to electrochemical oxidation [A. Berwick et al., Tetrahedron Letters (1976), (8), 631–4]. Normally these reactions lead to a mixture of isomeric di- and trihydroxydiamantanes. An alternative synthesis of the alcohols involves halogenation at the tertiary sites, followed by exchange of the halogens against the hydroxy groups. Substoichiometric esterification of the alcohols with methacryloyl chloride then yields a mixture of esters than can be separated by column chromatography or distillation, preferentially in a wiped film evaporator. It is also possible to use mixtures of different isomeric diamantane di- and tri-ol monomethacrylate esters without isolation of the individual components.

Another pathway to polymerizable monomers carrying side chains comprising higher adamantane units is the electrochemical mono-acetamidation of the corresponding polycyclic hydrocarbons [Vincent, F.; Tardivel, R.; Mison, P.; Schleyer, P. von Rague, Tetrahedron (1977), 33(3), 325–30]. Hydrolysis of the acetamides yields mono-amino derivatives. Monoamino derivatives can also be obtained by the bromination or chlorination of the corresponding hydrocarbons, followed by reaction with phthalimide and hydrolysis. The monoamino derivatives can then be reacted with methacryloyl chloride or vinyl sulfonyl chloride to give the corresponding amides. In this embodiment, the vinyl sulfonates are useful since their transparency at 193 nm is better than that of carboxylic acid amides. Both for sulfonamides or carboxylic amides, the free proton of the amido group is somewhat acidic and will be partly ionized by the aqueous base in the development step. This can be of advantage if a higher hydrophilicity of the protected polymer is desired; if it is not, a sulfonamide or carboxylic amide of a secondary amine can be used, which is obtained by alkylation either of the amino function before esterification or of the primary amide after the esterification.

The polymers of this invention can be synthesized using techniques known in the art. The polymer of this invention may be synthesized by free radical polymerization techniques using, for example, 2,2'-azobisisobutyronitrile (AIBN) as initiator. A mixture of monomers is added to a reaction vessel together with a solvent, e.g. tetrahydrofuran, and AIBN is added. The reaction is carried out at a suitable temperature for a suitable amount of time to give a polymer with desired properties. The reaction may also be carried out without a solvent. The temperature may range from about 35° C. to about 150° C., preferably 50° C. to 90° C. for about 5 to 25 hours The polymer may be isolated from any suitable solvent, such as, water, methanol, or petroleum spirits, either mixed or in pure form such as hexane or heptane. Other polymerization techniques may be used to obtain a polymer with the desired chemical and physical properties.

The percentage of the comonomers relative to the higher adamantane containing monomers within the polymer ranges from about 90 mole % to about 5 mole %, preferably from about 80 mole % to about 25 mole %, and most preferably from about 55 mole % to about 30 mole %.

The optimum molecular weight of the polymer is dependant on the monomers incorporated into the polymer, the photoactive compound and any other chemical components used, and on the lithographic performance desired. Typically, the weight average molecular weight is in the range of 3,000 to 50,000, the number average molecular weight is in the range from about 1500 to about 10,000, and the polydispersity is in the range 1.1 to 5, preferably 1.5 to 2.5.

Suitable examples, without limitation, of the acid generating photosensitive compound include onium-salts, such as, diazonium salts, iodonium salts, sulfonium salts, halides and esters, although any photosensitive compound that produces an acid upon irradiation may be used. The onium salts are usually used in a form soluble in organic solvents, mostly as iodonium or sulfonium salts, examples of which are diphenyliodonium trifluoromethanesulfonate, diphenyliodonium nonafluorobutanesulfonate, triphenylsulfonium trifluromethanesulfonate, triphenylsulfonium nonafluorobutanesufonate, and the like. Other compounds that form an acid upon irradiation may be used, such as triazines, oxazoles, oxadiazoles, thiazoles, substituted 2-pyrones, and oxime sulfonates. Phenolic sulfonic esters, bis-sulfonylmethanes, bis-sulfonylmethanes or bis-sulfonyldiazomethanes, are other examples. Other examples will also be well known to those skilled in the art. The above compounds can be used alone or in mixtures.

The solid components of the p resent invention are dissolved in an organic solvent. The amount of solids in the solvent or mixture of solvents ranges from about 5 weight % to about 50 weight %. The polymer may be in the range of 5 weight % to 90 weight % of the solids and the photoacid generator may be in the range of 2 weight % to about 50 weight % of the solids. Suitable solvents for such photoresists may include propylene glycol mono-alkyl ether, propylene glycol alkyl (e.g. methyl)ether acetate, ethyl-3-ethoxypropionate, xylene, diglyme, amyl acetate, ethyl lactate, butyl acetate, 2-heptanone, ethylene glycol monoethyl ether acetate, 3-methoxy-3-methyl butanol, butyl acetate, anisole, ethylene glycol monomethyl ether, ethylene glycol monoethyl ether, diethylene glycol monoethyl ether, ethylene glycol monoethyl ether acetate, ethylene glycol monomethyl acetate, methyl ethyl ketone, a monooxymonocarboxylic acid ester, such as methyl oxyacetate, ethyl oxyacetate, butyl oxyacetate, methyl methoxyacetate, ethyl methoxyacetate, butyl methoxyacetate, methyl ethoxyactetate, ethyl ethoxyacetate, methyl 3-oxypropionate, ethyl 3-oxypropionate, methyl 3-methoxypropionate, ethyl 3-methoxypropionate, methyl 2-oxypropionate, ethyl 2-oxypropionate, ethyl 3-hydroxypropionate, propyl 2-oxypropionate, methyl 2-ethoxypropionate, or propyl 2-methoxy propionate, and mixtures thereof.

Additives such as colorants, non-actinic dyes, anti-striation agents, plasticizers, adhesion promoters, coating aids, speed enhancers and surfactants may be added to the photoresist composition before the solution is coated onto a substrate. A sensitizer that transfers energy from a particular range of wavelengths to a different exposure wavelength may also be added to the photoresist composition.

In order to improve the stability of the photoresist image after exposure, bases or photobases may be added to the photoresist composition. These bases are known to those skilled in the art and some of them are described in U.S. Pat. No. 5,525,453 and U.S. Pat. No. 6,365,322. Bases, which do not absorb or do not absorb significantly at the wavelength of light used to expose the photoresist, are preferred. Examples of such bases include, but are not limted to those such as dimethyliodonium hydroxide, trimethylsulfonium hydroxide and 1,3,3-trimethyl-6-azabicyclo[3.2.1]octane.

The prepared photoresist composition solution can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds. The photoresist may also be coated over an antireflective coating.

The photoresist coatings produced by the described procedure are particularly suitable for application to aluminum/aluminum oxide coated wafers, such as are utilized in the production of microprocessors and other miniaturized integrated circuit components. A silicon/silicon dioxide wafer can also be used. The substrate may also comprise various polymeric resins, especially polymers such as polyesters or polyimides.

The photoresist composition solution is then coated onto the substrate, and the substrate is treated at a temperature from about 70° C. to about 150° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the solid components. In general, one desires to minimize the concentration of solvents and this first temperature treatment is conducted until substantially all of the solvents have evaporated and a thin coating of photoresist composition, on the order of half a micron (micrometer) or less in thickness, remains on the substrate. In a preferred embodiment the temperature is from about 95° C. to about 120° C. The treatment is conducted until the rate of change of solvent removal becomes relatively insignificant. The temperature and time selection depends on the photoresist properties desired by the user, as well as the equipment used and commercially desired coating times. The coating substrate can then be imagewise exposed to actinic radiation, e.g., ultraviolet radiation, at a wavelength of from about 100 nm to about 300 nm, x-ray (including EUV), particle-type radiation such as electron beam and ion beam, or laser radiation, in any desired pattern, produced by use of suitable masks, negatives, stencils, templates, etc.

The photoresist is then subjected to a post exposure second baking or heat treatment before development. The heating temperatures may range from about 90° C. to about 150° C., more preferably from about 100° C. to about 130° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed to remove the image-wise exposed areas by immersion in a developing solution or developed by a puddle or spray development process. The substrates are allowed to remain in the developer until all, or substantially all, of the photoresist coating has dissolved from the exposed areas. Developers include aqueous solutions of ammonium or alkali metal hydroxides that may optionally contain additives such as surfactants. One preferred developer is an aqueous solution of tetramethyl ammonium hydroxide. After removal of the coated wafers from the developing solution, one may conduct an optional post-development heat treatment or bake to increase the coating's adhesion and chemical resistance to etching conditions and other substances. The post-development heat treatment can comprise the oven or hot plate baking of the coating and substrate below the coating's softening point, or a UV or electron beam hardening process. In industrial applications, particularly in the manufacture of microcircuitry units on silicon/silicon dioxide-type substrates, the developed substrates may be treated with a buffered, hydrofluoric acid base etching solution or dry etching. The photoresist compositions of the present invention are resistant to acid-base etching solutions and provide effective protection for the unexposed photoresist-coating areas of the substrate.

As a variation of the above process, top or bottom antireflective coatings may be applied to the substrate and photoresist film prior to the imagewise exposure. In yet another embodiment of the invention, the exposure may be carried out in an exposure tool in which the space between the lens and the wafer is filled with a liquid (immersion lithography). In this case, the photoresist film may be optionally coated with a water-insoluble barrier coating prior to exposure. This water-soluble barrier coating may also optionally be removed prior to development.

The following examples provide illustrations of the methods of producing and utilizing compositions of the present invention. These examples are not intended, however, to limit or restrict the scope of the invention in any way and should not be construed as providing conditions, parameters or values which must be utilized exclusively in order to practice the present invention. Unless otherwise specified, all parts and percents are by weight.

EXAMPLES

Example 1

General polymerization procedure for polymers not containing maleic anhydride:

A copolymer is synthesized from the target monomer mixture in the presence of 15 weight % of AIBN in tetrahydrofuran (THF) at 30% solids. The reaction mixture is thoroughly deoxygenated by passing a stream of nitrogen through the reaction mixture prior to heating, then maintaining a nitrogen atmosphere over the polymerization during the remaining reaction. The reaction mixture is held at a slow reflux for 8 hours, then it is allowed to cool down and is diluted with a third of its volume of methanol. It is then added dropwise and with vigorous stirring to a large excess of methanol, yielding a fine white precipitate which is then isolated by suction filtration. The filtercake is re-dissolved in THF and precipitated into a large excess of hexane, heptane, or petrol ether. The filtration and re-precipitation steps into methanol and alkane are repeated a second time. The polymer is then dried overnight in a vacuum oven at 40° C. For the monomers in question, typical isolated polymer yields in this procedure are from between 60 to 70%.

Example 2

General polymerization procedure for polymers containing maleic anhydride:

A copolymer is synthesized from the target monomer mixture in the presence of 2 weight % of AIBN in tetrahydrofuran (THF) at 30% solids. The reaction mixture is thoroughly deoxygenated by passing a stream of dry nitrogen through the reaction mixture prior to heating. Following deoxygenation, the reaction is carried out under pressure for 18 hours, where the starting pressure is about 48,260 Pascals (7 psi). Following depressurization, the polymer is isolated from diethyl ether (1/10 v/v ratio) by two successive precipitations. The polymer is then dried overnight in a vacuum oven at 40° C. For the monomers in question, typical isolated polymer yields in this procedure are from between 55 to 65%.

Example 3

General photoresist formulation procedure:

The polymer of Example 1 or 2 is dissolved in propylene glycol monomethyl ether acetate (PGMEA) as an 8% solution (w/w). Triphenylsulfonium nonafluorobutane-sulfonate (TPS-Nf) is added at a level of 2% of the polymer weight, followed by an amount of diethanolamine (in the form of a 1% PGMEA solution) equivalent to 30 mole-% of the TPS-Nf. A small amount (about 0.001%) of FC-4430 surfactant (fluoroaliphatic polymeric ester, supplied by 3M Corporation, St. Paul, Minn.) is added in order to suppress striations and improve coating uniformity. The formulation is mixed overnight by agitation and is then filtered through depth and membrane filters, with the last filter having a pore size rating of 0.05 µm. If necessary additional solvent is added to allow the formulation to be coated at a film thickness of 280 nm.

Example 4

General photoresist testing procedure:

Using a Tokyo Electron (TEL) Mark 8 coating track, the photoresist of Example 2 is applied to a silicon wafer coated with AZ® ArF® 1C5B Bottom Antireflective Coating (available from Clariant Corporation, Somerville, N.J.) at a film thickness optimized to provide effective antireflection at a wavelength of 193 nm. The spin speed is adjusted in the range of 1500–4000 rpm to achieve a coated film thickness of 280 nm. If it is not possible to achieve the desired coating thickness within this range, the solids content of the formulation in Example 2 is adjusted accordingly. The wafer is then baked on a hot plate for 60 sec at a temperature of 110° C., followed by exposure on a Nikon S306C 193 nm scanner with an array of exposure and focus settings, using a binary mask and a numerical aperture of 0.78 and a partial coherence setting of 0.9. The photoresist is developed for 60 sec by puddling 2.38% tetramethylammonium hydroxide solution on the wafer. The wafer is then is rinsed with deionized water, and dried by spinning it at a high spin speed. The structures obtained are analyzed by secondary electron microscopes (SEMs), either a KLA8100 CD-SEM for lookdown images or a Hitachi S-4700 high resolution SEM for cleave images. A second set of wafers is coated directly on silicon and is not imaged or developed, but instead used for unpatterned (blanket) dry etch studies using a LAM 9400 dry etcher (settings: 300/150 W top/bottom power, 10 mT, 150 sccm HBr, 50 sccm $Cl_2$). The blanket etch rates are determined relative to a standard 193 nm photoresist formulation made from a polymer synthesized according to the procedure of Example 1 from a feed mixture of 40 mole-% 2-methyl-2-adamantane methacrylate (MAdMA), 35 mole-% alpha-(gamma-butyrolactone)-methacrylate (GBLMA), and 25 mole-% hydroxyadamantane methacrylate (HAdMA).

Example 5

A copolymer is synthesized from 40 mole-% MAdMA, 35 mole-% GBLMA and 25 mole-% of a mixture of isomeric hydroxydiamantane methacrylates according to the procedure of Example 1. A photoresist formulation is made according to the procedure of Example 3, and it is tested according to the procedure of Example 4. The photoresist cleanly resolves line features of 130 nm in size. The blanket dry etch rate of the photoresist is 16% lower than that of the standard 193 nm photoresist reference.

Example 6

A copolymer is synthesized from 40 mole-% 3-methyl-3-diamantane methacrylate, 35 mole-% GBLMA and 25 mole-% HAdMA according to the procedure of Example 1. A photoresist formulation is made according to the procedure of Example 3, and it is tested according to the procedure of Example 4. The photoresist cleanly resolves line features of 130 nm in size. The blanket dry etch rate of the photoresist is 16% lower than that of the standard 193 nm photoresist reference.

Example 7

A copolymer is synthesized from 40 mole-% 3-methyl-3-diamantane methacrylate, 35 mole-% GBLMA and 25 mole-% a mixture of isomeric hydroxydiamantane methacrylates according to the procedure of Example 1. A photoresist formulation is made according to the procedure of Example 3, and it is tested according to the procedure of Example 4. The photoresist cleanly resolves line features of 130 nm in size. The blanket dry etch rate of the photoresist is 29% lower than that of the standard 193 nm photoresist reference.

Example 8

A copolymer is synthesized from 40 mole-% 3-methyl-3-diamantane methacrylate, 30 mole-% GBLMA and 30 mole-% of a mixture of isomeric dihydroxydiamantane monovinyl ethers according to the procedure of Example 1. A photoresist formulation is made according to the procedure of Example 2, and it is tested according to the procedure of Example 3. The photoresist cleanly resolves line features of 130 nm in size. The blanket dry etch rate of the photoresist is 32% lower than that of the standard 193 nm photoresist reference.

Example 9

A copolymer is synthesized from 40 mole-% 3-methyl-3-diamantane methacrylate, 30 mole-% GBLMA and 30 mole-% of the vinyl sulfonamide of 4-aminodiamantane according to the procedure of Example 2. A photoresist formulation is made according to the procedure of Example 2, and it is tested according to the procedure of Example 3. The photoresist cleanly resolves line features of 130 nm in size. The blanket dry etch rate of the photoresist is 31% lower than that of the standard 193 nm photoresist reference.

Example 10

A copolymer is synthesized from 40 mole-% 3-methyl-3-diamantane methacrylate, 30 mole-% GBLMA, 15 mole-% t-butyl norbornene carboxylate and 15 mole-% maleic anhydride according to the procedure of Example 2. A photoresist formulation is made according to the procedure of Example 3, and it is tested according to the procedure of Example 4. The photoresist cleanly resolves line features of 130 nm in size. The blanket dry etch rate of the photoresist is 23% lower than that of the standard 193 nm photoresist reference.

What is claimed is:

1. A photoresist composition comprising:
    a) a polymer that is insoluble in an aqueous alkaline solution and comprises at least one acid labile group, and comprises at least one monomer unit having a pendant group selected from unsubstituted or substituted diamantane, triamantane or mixtures thereof; and
    b) a compound capable of producing an acid upon irradiation, wherein the monomer unit is selected from

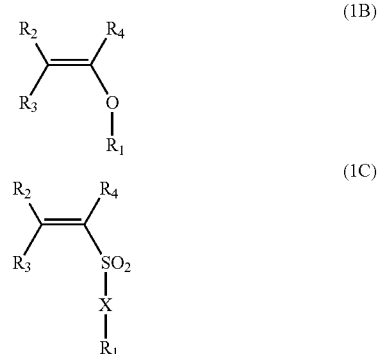

wherein
$R_1$ is -Z or —Y-Z where Y is a linear or branched alkylene or a monocyclic or polycyclic alkylene, Z is unsubstituted or substituted diamantane, triamantane or mixtures thereof;
$R_2$, $R_3$, and $R_4$ are each independently selected from hydrogen, alkyl, alkoxyalkyl, cycloalkyl, cycloalkenyl, aryl, aralkyl, and CN or any two of $R_2$, $R_3$, and $R_4$ together with the carbon atoms to which they are attached form an unsubstituted or substituted mono- or polycycloalkenyl; X is O or $NR_2$.

2. The photoresist composition of claim 1 wherein the monomer unit is

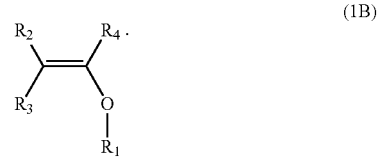

3. The photoresist composition of claim 2 wherein the diamantane and triamantane is substituted by one or more groups selected from hydroxy, hydroxyalkyl, alkyl, alkoxy, aryl, cycloalkyl, cycloalkyloxy, alkoxyalkyl, alkoxycycloalkyl, aryloxy, halogen, —O—(CH$_2$)$_n$—COOtBu, where n is 1 to 5, and where a carbon atom within the diamantane and triamantane is replaced by A-(CH$_2$)$_j$—C(=O)—O—B where j is 0 to 5 and A and B represent direct bonds to adjacent carbon atoms to the replaced carbon atom.

4. The photoresist composition of claim 1 wherein the monomer unit is

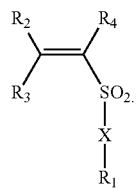

(1C)

5. The photoresist composition of claim 4 wherein X is O.
6. The photoresist composition of claim 4 wherein X is NR$_2$.
7. The photoresist composition of claim 4 wherein the diamantane and triamantane is substituted by one or more groups selected from hydroxy, hydroxyalkyl, alkyl, alkoxy, aryl, cycloalkyl, cycloalkyloxy, alkoxyalkyl, alkoxycycloalkyl, aryloxy, halogen, —O—(CH$_2$)$_n$—COOtBu, where n 1 to 5, and where a carbon atom within the diamantane and triamantane is replaced by A-(CH$_2$)$_j$—C(=O)—O—B where j is 0 to 5 and A and B represent direct bonds to adjacent carbon atoms to the replaced carbon atom.
8. The photoresist composition according to claim 1, where the compound capable of producing an acid upon irradiation is a sulfonium or iodonium salt.
9. The photoresist composition according to claim 1, where the compound capable of producing an acid upon irradiation is selected from triphenylsulphonium nonafluorobutanesulfonate, diphenyliodonium trifluoromethanesulfonate, diphenyliodonium nonafluorobutanesulfonate, triphenylsulfonium trifluoromethanesulfonate, triazines, oxazoles, oxadiazoles, thiazoles, substituted 2-pyrones, phenol sulfonic esters, bis-sulfonylmethanes, bis-sulfonylmethanes and bis-sulfonyldiazomethanes.
10. A process of imaging a positive photoresist composition comprising the steps of:
   a) coating a substrate with a film of photoresist composition of claim 1;
   b) baking the substrate to substantially remove the solvent;
   c) imagewise irradiating the photoresist film;
   d) baking the photoresist film; and,
   e) developing the irradiated photoresist film using an alkaline developer.
11. The process according to claim 10, further comprising coating an antireflective film on the substrate prior to coating the photoresist.
12. The process of claim 10, wherein the photoresist film is imagewise irradiated with light of wavelength in the range of 10 nm to 300 nm.
13. The process of claim 12, wherein the wavelength is selected from the following: 248 nm, 193 nm, 157 nm, 13.4 nm.
14. The process of claim 12, where the imagewise irradiation is carried out with particle-type radiation.
15. The process of claim 10, wherein the baking in step d) ranges from a temperature of from about 90° C. to about 150° C. for from about 30 seconds to about 180 seconds on a hot plate or from about 15 minutes to about 40 minutes in an oven.
16. The process of claim 10, wherein the alkaline developer in step e) comprises an aqueous solution of tetramethyl ammonium hydroxide.
17. The process of claim 10, in which the photoresist is subjected to a further heating step after step e).
18. The process of claim 10, in which the photoresist is subjected to a curing process after step e) comprising irradiating it with short wavelength or electron-beam radiation.
19. A compound of the formula

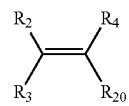

(1)

wherein
R$_{20}$ is selected from

—O—R$_1$   and   —SO$_2$X—R$_1$;

R$_1$ is -Z or —Y-Z where Y is a linear or branched alkylene or a monocyclic or polycyclic alkylene, Z is unsubstituted or substituted diamantane, triamantane or mixtures thereof; R$_2$, R$_3$, and R$_4$ are each independently selected from hydrogen, alkyl, alkoxyalkyl, cycloalkyl, cycloalkenyl, aryl, aralkyl, and CN or any two of R$_2$, R$_3$, and R$_4$ together with the carbon atoms to which they are attached form an unsubstituted or substituted mono- or polycycloalkenyl; X is O or NR$_2$.
20. The compound of claim 19 wherein R$_{20}$ is —O—R$_1$.
21. The compound of claim 19 wherein R$_{20}$ is —SO$_2$—X—R$_1$.
22. The compound of claim 19 wherein the diamantane and triamantane is substituted by one or more groups selected from hydroxy, hydroxyalkyl, alkyl, alkoxy, aryl, cycloalkyl, cycloalkyloxy, alkoxyalkyl, alkoxycycloalkyl, aryloxy, halogen, —O—(CH$_2$)$_n$—COOtBu, where n is 1 to 5, and where a carbon atom within the diamantane and triamantane is replaced by A-(CH$_2$)$_j$—C(=O)—O—B where j is 0 to 5 and A and B represent direct bonds to adjacent carbon atoms to the replaced carbon atom.
23. A polymer comprising at least one repeating unit represented by formula (2)

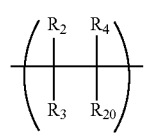

(2)

wherein
R$_{20}$ is selected from

—O—R$_1$   and   —SO$_2$X—R$_1$;

$R_1$, is -Z or —Y-Z where Y is a linear or branched alkylene or a monocyclic or polycyclic alkylene, Z is unsubstituted or substituted diamantane, triamantane or mixtures thereof; $R_2$, $R_3$, and $R_4$ are each independently selected from hydrogen, alkyl, alkoxyalkyl, cycloalkyl, cycloalkenyl, aryl, aralkyl, and CN or any two of $R_2$, $R_3$, and $R_4$ together with the carbon atoms to which they are attached form an unsubstituted or substituted mono- or polycycloalkenyl; X is O or $NR_2$.

24. The polymer of claim 23 wherein $R_{20}$ is —O—$R_1$.

25. The polymer of claim 23 wherein $R_{20}$ is —$SO_2$—X—$R_1$.

26. The polymer of claim 23 wherein the diamantane and triamantane is substituted by one or more groups selected from hydroxy, hydroxyalkyl, alkyl, alkoxy, aryl, cycloalkyl, cycloalkyloxy, alkoxyalkyl, alkoxycycloalkyl, aryloxy, halogen, —O—$(CH_2)_n$—COOtBu, where n is 1 to 5, and where a carbon atom within the diamantane and triamantane is replaced by A-$(CH_2)$—C(=O)—O—B where j is 0 to 5 and A and B represent direct bonds to adjacent carbon atoms to the replaced carbon atom.

\* \* \* \* \*